US008334165B2

(12) United States Patent
Xi et al.

(10) Patent No.: US 8,334,165 B2
(45) Date of Patent: Dec. 18, 2012

(54) PROGRAMMABLE METALLIZATION MEMORY CELLS VIA SELECTIVE CHANNEL FORMING

(75) Inventors: Haiwen Xi, Prior Lake, MN (US); Ming Sun, Eden Prairie, MN (US); Dexin Wang, Eden Prairie, MN (US); Shuiyuan Huang, Apple Valley, MN (US); Michael Tang, Bloomington, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 38 days.

(21) Appl. No.: 12/761,899

(22) Filed: Apr. 16, 2010

(65) Prior Publication Data

US 2010/0197104 A1 Aug. 5, 2010

Related U.S. Application Data

(62) Division of application No. 12/170,519, filed on Jul. 10, 2008, now Pat. No. 8,097,902.

(51) Int. Cl.
*H01L 21/00* (2006.01)

(52) U.S. Cl. ... 438/95; 257/154; 257/537; 257/E27.004; 257/E27.006; 257/E27.071

(58) Field of Classification Search ............ 257/154, 257/E27.004, E27.071, 537, E27.006; 438/95
See application file for complete search history.

(56) References Cited

U.S. PATENT DOCUMENTS

| | | | |
|---|---|---|---|
| 4,320,191 A * | 3/1982 | Yoshikawa et al. ........ 430/296 |
| 6,818,481 B2 | 11/2004 | Moore | |
| 6,867,114 B2 | 3/2005 | Moore | |
| 7,101,728 B2 | 9/2006 | Kozicki | |
| 7,142,450 B2 | 11/2006 | Kozicki | |
| 7,169,635 B2 | 1/2007 | Kozicki | |
| 7,372,065 B2 | 5/2008 | Kozicki | |
| 2002/0123170 A1* | 9/2002 | Moore et al. ............ 438/102 |
| 2004/0124407 A1 | 7/2004 | Kozicki | |
| 2006/0043354 A1 | 3/2006 | Pinnow | |
| 2006/0046444 A1* | 3/2006 | Campbell et al. ......... 438/510 |
| 2006/0060832 A1 | 3/2006 | Symanczyk | |
| 2006/0141713 A1 | 6/2006 | Happ | |
| 2006/0240616 A1* | 10/2006 | Daley et al. .............. 438/257 |
| 2007/0008865 A1 | 1/2007 | Adams | |
| 2009/0014704 A1* | 1/2009 | Chen et al. ..................... 257/3 |

OTHER PUBLICATIONS

Cha et al., High Trap Density and Long Retention Time from Self-Assembled Amorphous Si Nanocluster Floating Gate Nonvolatile Memory, Appl. Phy. Ltrs 89, 243513 (2006).
Huang et al., Observation of Isolated Nanpores Formed by Patterned Anodic Oxidation of Aluminum Thin Films, Appl. Phy. Ltrs 88, 233112 (2006).
Kozicki et al., Nanoscale Memory Elements Baesd on Solid-State Electrolytes, IEEE Trans. on Nanotechnology, vol. 4, No. 3, May 2005.
Li et al., Polycrystalline and Monocrystalline Pore Arrays with Large Interpore Distance in Anodic Alumina, Electrochemical and Solid-State Letters, 3 (3) 131-134 (2000).

(Continued)

*Primary Examiner* — John C Ingham
(74) *Attorney, Agent, or Firm* — Mueting Raasch & Gebhardt PA

(57) ABSTRACT

Methods for making a programmable metallization memory cell are disclosed.

18 Claims, 4 Drawing Sheets

OTHER PUBLICATIONS

Masuda, et al., Highly Ordered Nanochannel-Array Architecture in Anodic Alumina, Appl. Phys. Ltrs 71 (19), Nov. 10, 1997.
Murphy et al., Nanoimprint Mold Fabrication and Replication by Room-Temperature Conformal Chemical Vapor Deposition, Appl. Phys. Ltrs 90, 203115 (2007).
Wu et al., Self-Organized Tantalum Oxide Nanopyramidal Arrays for Antireflective Structure, Appl. Phy. Ltrs 90, 171911 (2007).
Xia, et al., Ultrafast Patterning of Nanostructures in Polymers Using Laser Assisted Nanoimprint Lithography, Appl. Phy. Ltrs 83, No. 21 (Nov. 24, 2003).

* cited by examiner

PROGRAMMABLE METALLIZATION MEMORY CELLS VIA SELECTIVE CHANNEL FORMING

CROSS-REFERENCE

This application is a divisional of application Ser. No. 12/170,519, filed Jul. 10, 2008, the contents of each is hereby incorporated by reference in its entirety.

BACKGROUND

Memory devices are common in electronic systems and computers to store data. These memory devices may be volatile memory, where the stored data is lost if the power source is disconnected or removed, or non-volatile, where the stored data is retained even during power interruption. An example of a non-volatile memory device is the programmable conductor random access memory that utilizes a programmable metallization cell (PMC).

A PMC utilizes a fast ionic conductor or a solid ionic electrolyte, such as a chalcogenide or oxide material, that may be embedded with a superionic phase. The electrolyte is present between two electrodes of different reduction/oxidation potential, one electrode being an active electrode and the other an inert electrode, often composed of a noble metal. When a bipolar voltage is applied between the two electrodes, superionic clusters or metal filaments grow or dissolve in the electrolyte, to change the resistance of the cell. The fast ion conductor material and superionic clusters are important elements of the PMC. Construction and configuration of the superionic clusters is important for providing effective and reliable programming of the PMC.

The present invention comprises fabrication techniques to form a programmable metallization cell, for use in a programmable conductor random access memory, which will become apparent to those skilled in the art from the following disclosure.

BRIEF SUMMARY

This present disclosure is to methods for forming programmable conductor dynamic random access memories utilizing a programmable metallization cell. The present disclosure is to programmable metallization cells and memory arrays including those cells. The cells include at least one superionic columnar structure formed by an apertured layer.

In one particular embodiment, this disclosure is to a programmable metallization memory cell that has an inert electrode and an active electrode, a metal layer proximate the active electrode, and an internal layer between the metal layer and the inert electrode. The internal layer includes fast ion conductor material and an apertured layer comprising at least one aperture therethrough, with the fast ion conductor material present at least in the aperature. In some embodiments, the fast ion conductor material includes superionic clusters present within the at least one aperture. The superionic clusters may extend past the at least one aperture. In another particular embodiment, the memory cell has an internal layer than includes an apertured layer in which at least one aperture defines at least a portion of a columnar superionic cluster within a fast ion conductor material. The aperture may define the entire columnar superionic cluster.

In another particular embodiment, this disclosure is to a method of making a programmable memory cell. The method includes providing an inert electrode, positioning an apertured insulating layer having at least one aperture therein proximate the inert electrode, applying a fast ion conductor material within the at least one aperture of the apertured layer, applying a metallic material over the apertured layer and the fast ion conductor material, irradiating the metallic material to cause metal ions to at least partially dissolve into the fast ion conductor material, and after irradiating, providing an active electrode over the metallic material. The irradiating may be done in conjunction with heating.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
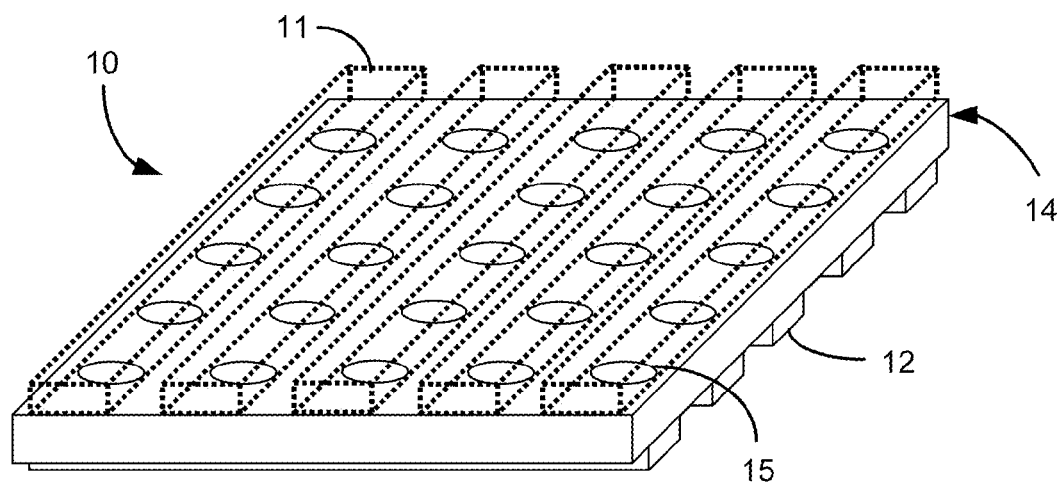
FIG. 1 is a schematic perspective view of a memory array having programmable metallization memory cells according to the present disclosure.

The present disclosure is to programmable metallization memory cells and memory arrays including those cells. Programmable metallization cell (PMC) memory is based on the physical re-location of superionic regions within a solid electrolyte material. A PMC memory cell includes two solid metal electrodes, one relatively inert the other electrochemically active, with fast ion conductor material, i.e., the electrolyte material with superionic regions, between the electrodes. When a negative bias is applied to the inert electrode, metal ions in the fast ion conductor material, as well as some originating from the now-positive active electrode, flow and are reduced by the inert electrode. After a short period of time the flowing ions form clusters of the superionic regions between the two electrodes. The superionic clusters are a linked chain of superionic regions, extending from the inert electrode to the active electrode. The clusters dramatically reduce the resistance between the electrodes, which can be measured to indicate that the "writing" process is complete.

Reading the PMC simply requires a small voltage applied across the cell. If the linked superionic clusters are present in that cell, the resistance will be low, leading to higher current, which can be read as a "1". If there are no superionic clusters present or the linkage of the superionic clusters is broken, the resistance is higher, leading to low current, which can be read as a "0".

Erasing the cell is similar to writing, but uses a positive bias on the inert electrode. The metal ions will migrate away from the superionic clusters, back into the fast ion conductor material, and eventually to the negatively-charged active electrode. This breaks the linkage of the superionic clusters and increases the resistance of the fast ion conductor material.

The present disclosure is to programmable metallization memory cells and memory arrays including those cells. The memory cells include an apertured layer that defines at least a portion of a column of fast ion conductor material having superionic regions therein, which when connected, form superionic clusters that provide electron flow through the memory cell. In some embodiments, the apertured layer defines at least a portion of a plurality of columns. Further in some embodiments, the apertured layer defines at least one column or a plurality of columns.

The present disclosure is also to methods of forming programmable metallization memory cells having at least one columnar region of fast ion conductor material. The methods include providing an apertured electrically insulating layer having a fast ion conductor material (for example, a base glass such as a chalcogenide material having superionic regions therein) within the apertures proximate an oxidizable metal layer (for example, silver (Ag), tellurium (Te), or copper (Cu)), and diffusing metal ions from the oxidizable metal layer into the fast ion conductor material within the apertures to produce superionic clusters extending to an electrode. The diffusion of metal ions into the fast ion conductor material to form the clusters may be done with ultraviolet light or ultraviolet light in combination with a heat treatment. In some embodiments, the columnar superionic clusters extend past the apertured layer.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

FIG. 1 illustrates a generic array 10 having a plurality of word lines 11 and bit lines 12 that may be orthogonal to word lines 11. Word lines 11 and bit lines 12 are operably connected to a programmable metallization memory cell 14 that, in this embodiment, has a plurality of memory units 15. Array 10 is a crosspoint array structure. A select device, such as diode or transistor, may be present at each crosspoint. Memory units 15 are a columnar structure of superionic clusters at least partially defined by an apertured layer material within memory cell 14, as described below.

Figure 2:
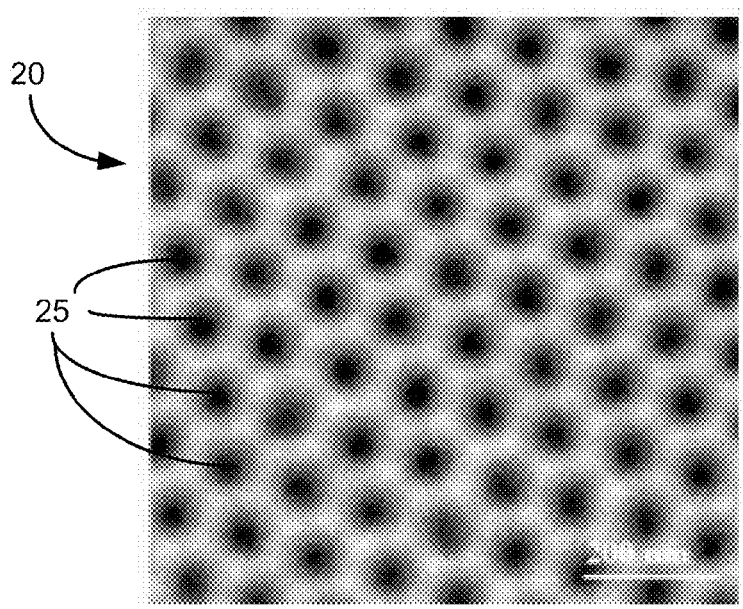
FIG. 2 is a microphotograph of an ordered porous layer suitable for the programmable metallization memory cells of this disclosure.

An example of an apertured layer material 20 is shown in FIG. 2. Layer material 20 has at least one, but usually a plurality of apertures 25 extending through material 20, forming at one but usually a plurality of columnar passages or vias therethrough. In the illustrated embodiment, apertures 25 are non-random and precisely spaced; in alternate embodiments, the apertures may be randomly ordered and/or with inconsistent spacing therebetween. For material 20 of FIG. 2, each aperture 25 has a generally circular cross-section with a diameter of about 50 nm. Other apertured materials suitable for the memory cells of this disclosure may have columnar passages with a cross-section that is oval, square, rectangular, irregular, etc. with a largest dimension of about 2-200 nm, in some embodiments about 5-100 nm, and in some other embodiments about 20-50 nm or about 15-50 nm. Apertures 25 occupy at least about 10% and no more than about 90% of the area of material 20. In some embodiments, apertures 25 occupy about 25%-75% of the surface area of material 20. The thickness of apertured layer material 20 may be, for example 10 nm-5 micrometers, in some embodiments, about 20 nm-1 micrometer. In some embodiments, the thickness of material 20 is about 20-50 nm. Apertured material 20 may be referred to as a nanochanneled, or as a nano array.

Apertured layer material 20 is electrically insulating and nonconductive. In some embodiments, apertured material 20 is a dielectric. Examples of suitable materials for material 20 include alumina ($Al_2O_3$), zirconia ($ZrO_2$), silicon dioxide ($SiO_2$), and silicon nitride ($Si_3N_4$).

Figure 3:
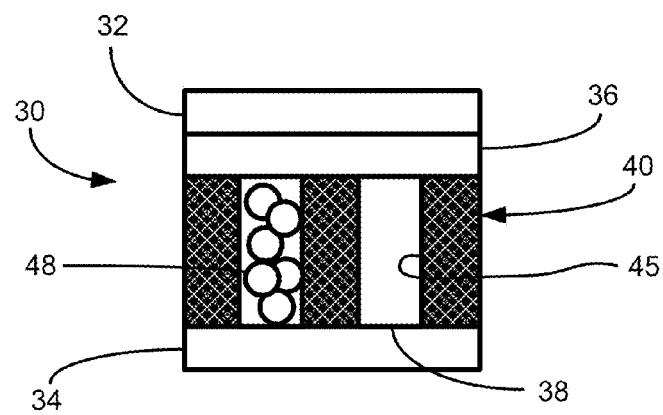
FIG. 3 is a schematic side view of a first embodiment of a programmable metallization memory cell according to this disclosure.

A first embodiment of a programmable metallization memory cell according to this disclosure is illustrated in FIG. 3 as memory cell 30. Memory cell 30 has a first electrode 32 (in this figure, illustrated at the top of cell 30) and a second electrode 34 (in this figure, illustrated at the bottom of cell 30). Electrodes 32, 34 are formed of electrically conducting material, for example, metal. First electrode 32 is an electrochemically active electrode. Second electrode 34 is an inert electrode, made of, for example, tungsten (W) or a noble metal such as gold (Au), platinum (Pt), palladium (Pd) and rhodium (Rh). Electrodes 32, 34 form the electrical connection with word lines 11 and bit lines 12 when memory cell 30 is operably configured in an array such as array 10.

Positioned proximate active electrode 32 is a thin metal layer 36; active electrode 32 is so named because of its proximately to metal layer 36. Metal layer 36 is selected based on its ion diffusivity. In many embodiments, metal layer 36 is electrochemically active, made of an oxidizable material, for example, silver (Ag), copper (Cu), tantalum (Ta), titanium (Ti), etc. In some embodiments, thin metal layer 36 is positioned adjacent to electrode 32, without intervening layers. Metal layer 36 often has a thickness of about 2-50 nm.

In some embodiments, a single metal layer may be used as both active electrode 32 and thin metal layer 36. That is, two separate layers of material do not exist, but rather, a single layer functions as both active electrode 32 and thin metal layer 36.

Between inert electrode 34 and thin metal layer 36 is positioned an internal layer that includes a fast ion conductor material 38 and an apertured insulating material 40. In this embodiment, both fast ion conductor material 38 and apertured material 40 or the internal layer are positioned adjacent to thin metal layer 36, without intervening layers. Apertured insulating material 40 has at least one aperture 45 therein, in some embodiments, a plurality of apertures 45 therein, with the apertures extending through material 40. In FIG. 3, apertured material 40 is illustrated has having two apertures 45 extending through material 40 from inert electrode 34 to metal layer 36. Apertured material 40 can be apertured material 20 of FIG. 2 or any of the various embodiments described. Fast ion conductor material 38 is present within apertures 45.

Fast ion conductor material 38 may be a base glass material, such as a germanium selenide (GeSe) material. In some embodiments, germanium selenide materials are referred to as chalcogenide glass or chalcogenide materials. Specific examples of suitable fast ion conductor material 38 include $Ge_3Se_7$, $Ge_4Se_6$, and $Ge_2Se_3$, although numerous germanium selenide materials are known and can be used.

Fast ion conductor material 38 includes region of superionic material therein. Defined by apertures 45, the regions form columnar clusters 48 that facilitate the transfer of electrons between electrode 32 and electrode 34. Superionic clusters 48 form when metal ions from fast ion conductor material 38 and from metal layer 36 flow to inert electrode 34. In accordance with this disclosure, UV light with optional heating is used to initiate the flow of metal ions. To decrease the detail in FIG. 3, superionic clusters 48 are illustrated in only one of apertures 45, although they are present in both apertures 45.

Figure 4:
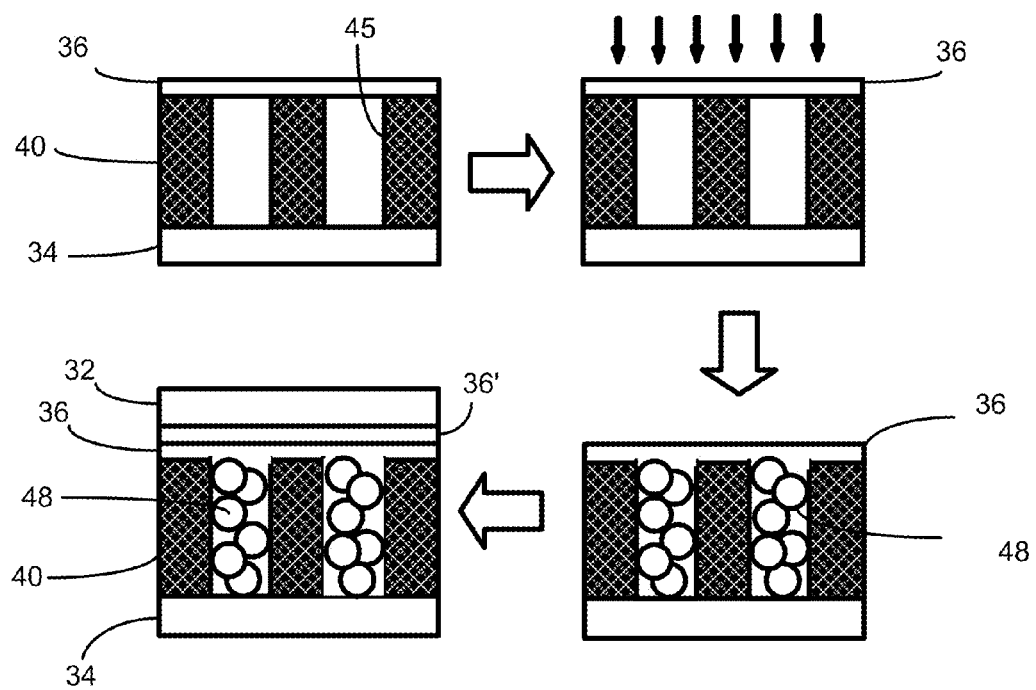
FIG. 4 illustrates a step-wise process for producing the memory cell of FIG. 3.

A process for making memory cell 30 is stepwise illustrated in FIG. 4.

A layered structure is formed by placing apertured material 40 on inert electrode 34 applying fast ion conductor material 38 into apertures 45 of material 40. Thin metal layer 36 is applied onto the filled apertures. UV light is irradiated onto metal layer 36, dissolving ions from metal layer 36 into fast ion conductor material 38 to form superionic clusters 48. As an example, if chalcogenide glass $Ge_3Se_7$ is the fast ion conductor material 38, and thin metal layer 36 is silver (Ag), the resulting superionic clusters 48 comprise chalcogenide-metal ion material $AgGe_3Se_7$.

In alternate processes, heat may be used, usually in conjunction with UV light, to dissolve ions from metal layer 36 into material 38. The UV and/or heating process is sufficient to cause the desired diffusion of metal ions from layer 36 into fast ion conductor material 38 to form superionic clusters 48. By limiting the irradiation and/or heating of fast ion conductor material 38 to apertures 45 superionic clusters 48 are more precisely defined as columnar extensions between electrode 32 and electrode 34. It is preferred that the resultant metal ion concentration in the glass material be about 20-40%, to ensure the formation of the conductive path of superionic clusters during the eventual programming of memory cell 30.

After forming clusters 48, a second thin metal layer 36' may be optionally applied prior to positioning active electrode 34 there over. Second metal layer 36' is typically the same material as metal layer 36 and is used to replenish layer 36.

The application of the various layers or materials described above can be done using conventional wafer processing techniques, including physical vapor deposition, chemical vapor deposition, photolithography or other thin film processing techniques.

Figure 5:
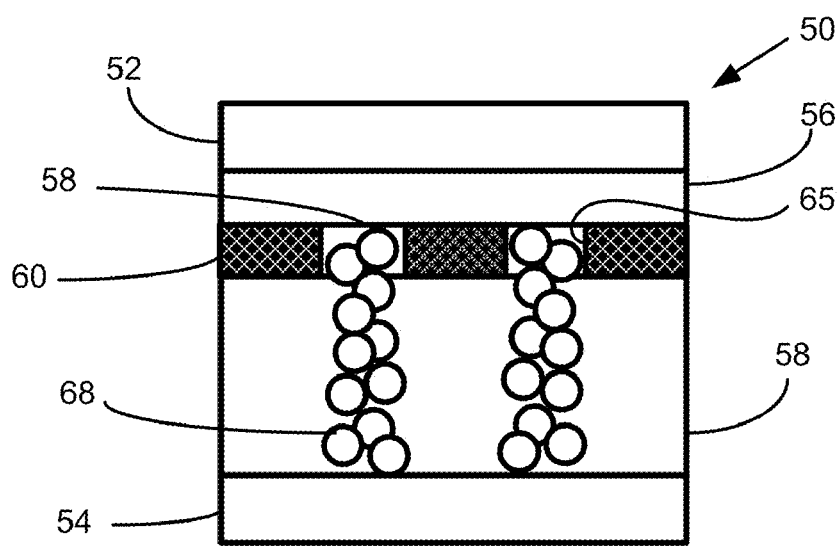
FIG. 5 is a schematic side view of a second embodiment of a programmable metallization memory cell according to this disclosure.

In memory cell 30, apertured layer 40 defines columns of superionic clusters 48. Alternate embodiments of PMC memory cells and methods of making are illustrated in FIGS. 5 though 8, where an apertured layer defines at least a portion of a column of superionic clusters. The general features of the various elements of the memory cells and methods of making are similar or the same across the embodiments, unless otherwise indicated.

A second embodiment of a programmable metallization memory cell according to this disclosure is illustrated in FIG. 5 as memory cell 50. Memory cell 50 has a first, active electrode 52 and a second, inert electrode 54. Positioned proximate active electrode 52 is a thin metal layer 56. Between inert electrode 54 and thin metal layer 56 is positioned an internal layer that includes a fast ion conductor material 58 and an apertured insulating material 60. Apertured insulating material 60 has at least one aperture 65, in some embodiments, a plurality of apertures 65, extending through material 60. In FIG. 5, apertured material 60 is illustrated as having two apertures 65 extending through material 60. Fast ion conductor material 58 is present within apertures 65.

Unlike memory cell 30 of FIG. 3, fast ion conductor material 58 is present in regions of the internal layer other than only in apertures 65 of apertured material 60. In this embodiment, fast ion conductor material 58 is also present between apertured material 60 and inert electrode 54. Fast ion conductor material 58 includes region of superionic material therein. Partially defined by apertures 65, the superionic regions form columnar clusters 68 that facilitate the transfer of electrons between electrode 52 and electrode 54. Superionic clusters 68 form when metal ions from fast ion conductor material 58 and from metal layer 56 flow to inert electrode 54. In accordance with this disclosure, UV light with optional heating, is used to initiate the flow of metal ions. In memory cell 50, a portion of superionic clusters 68 is present within apertures 65 and a portion of superionic clusters 68 is not present within apertures 65. The cross-section of the portion not within apertures 65 may increase as the distance from apertured material 60 increases. That is, the cross-sectional area of superionic clusters 68 not within apertures 65 may be larger than the area of apertures 65.

Figure 6:
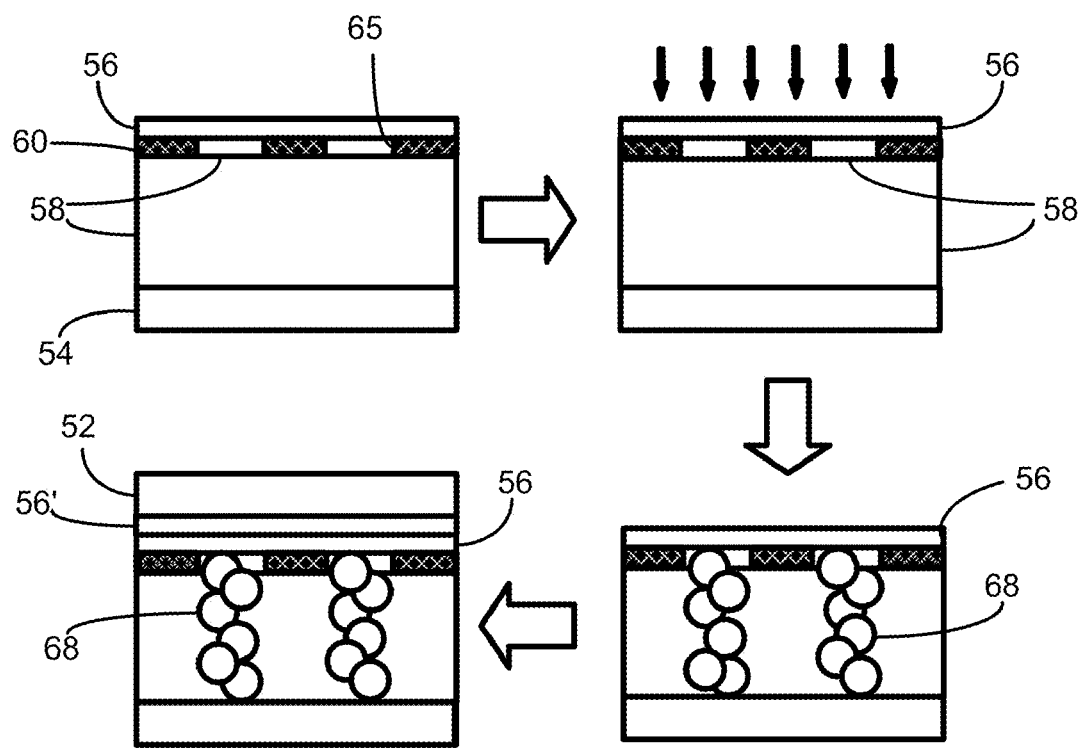
FIG. 6 illustrates a step-wise process for producing the memory cell of FIG. 5.

A process for making memory cell 50 is stepwise illustrated in FIG. 6.

A layered structure is formed by applying fast ion conductor material 58 on inert electrode 54. Apertured material 60 is positioned over fast ion conductor material 58 so that material 58 fills apertures 65; in some embodiments, additional material 58 is added to better fill apertures 65. Thin metal layer 56 is applied onto the filled apertures 65. UV light is irradiated onto metal layer 56, dissolving ions from metal layer 56 into fast ion conductor material 58 to form superionic clusters 68. In alternate processes, heat may be used, usually in conjunction with UV light, to dissolve ions from metal layer 56. By limiting the irradiation and/or heating of fast ion conductor material 58 to apertures 65, superionic clusters 68 are more precisely defined as columnar extensions between electrode 52 and electrode 54, although the entire length of clusters 68 is not restricted by apertures 65. After forming clusters 68, a second thin metal layer 66' may be optionally applied prior to positioning active electrode 52 there over. Second metal layer 66' is typically the same material as metal layer 66 and is used to replenish layer 66.

The application of the various layers or materials described above can be done using conventional wafer processing techniques, including physical vapor deposition, chemical vapor deposition, photolithography or other thin film processing techniques.

Figure 7:
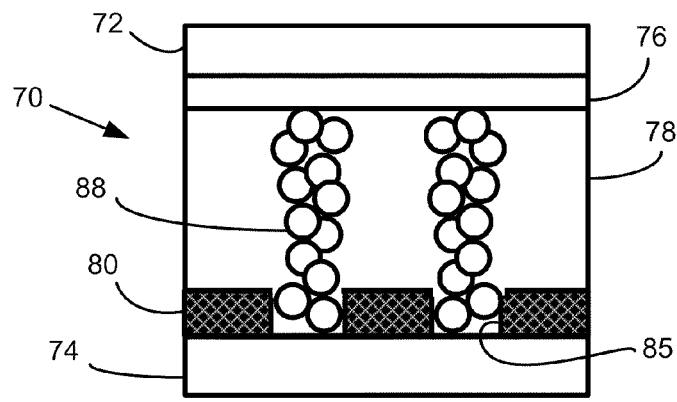
FIG. 7 is a schematic side view of a third embodiment of a programmable metallization memory cell according to this disclosure.

A third embodiment of a programmable metallization memory cell according to this disclosure is illustrated in FIG. 7 as memory cell 70. Memory cell 70 has a first, active electrode 72 and a second, inert electrode 74. Positioned proximate active electrode 72 is a thin metal layer 76. Between inert electrode 74 and thin metal layer 76 is positioned an internal layer that includes a fast ion conductor material 78 and an apertured insulating material 80. Within the internal layer, apertured material 80 is closer to second electrode 74 than to first electrode 72, and in some embodiments, is adjacent to second, inert electrode 74. Apertured insulating material 80 has at least one aperture 85, in some embodiments, a plurality of apertures 85, extending through material 80. In FIG. 7, apertured material 80 is illustrated having two apertures 85 extending through material 80. Fast ion conductor material 78 is present within apertures 85.

Similar to memory cell 50 of FIG. 5, fast ion conductor material 78 is present in regions other than only apertures 85 of apertured material 80. In this embodiment, fast ion conductor material 78 is also present between apertured material 80 and active electrode 72. Fast ion conductor material 78 includes region of superionic material therein. Partially defined by apertures 85, the superionic regions form columnar clusters 88 that facilitate the transfer of electrons between electrode 72 and electrode 74. In memory cell 70, a portion of superionic clusters 88 is present within apertures 85 and a portion of superionic clusters 88 is not present within apertures 85. The cross-section of the portion not within apertures 85 may increase as the distance from apertured material 80 increases. Superionic clusters 88 form when metal ions from fast ion conductor material 78 and from metal layer 76 flow to inert electrode 74. The method of making memory cell 70 can be done in a manner similar to memory cell 30 or memory cell 50.

In yet another alternate embodiment of a programmable metallization cell according to this disclosure, the apertured material is adjacent to neither of the thin metal layer nor the inert electrode, but rather, an intervening layer or fast conductor material is present between the apertured material and the thin metal layer and between the apertured material and the inert electrode. For example, the apertured material may be centrally positioned between the thin metal layer and the inert electrode.

Figure 8:
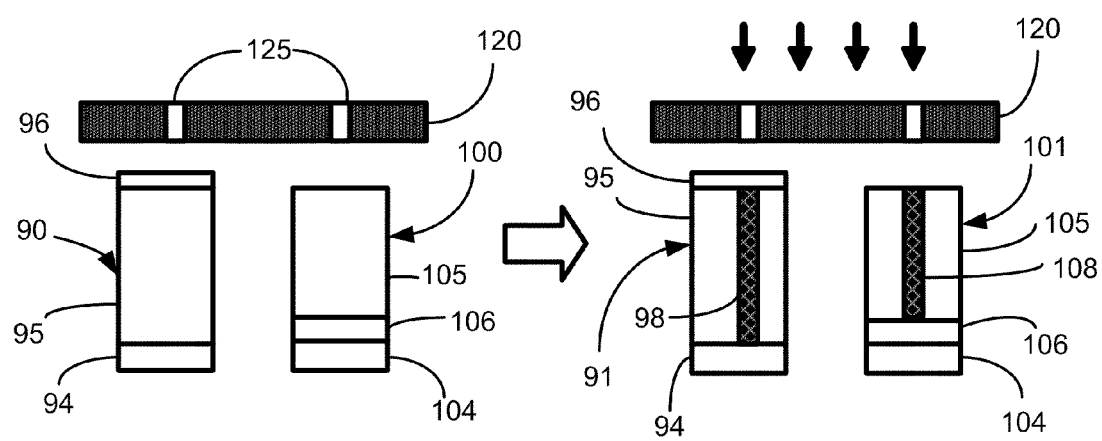
FIG. 8 is a schematic side view of fourth and fifth embodiments of programmable metallization memory cells according to this disclosure and a process for producing those memory cells.

In the previous embodiments, including memory cell 30, memory cell 50, and memory cell 70, apertured layer 40, 60, 80 is a distinct layer within the memory cell. The following embodiments are formed using an apertured layer that does not remain as a distinct layer within the memory cell. The apertured layer is utilized as a mask to form columns of superionic clusters. FIG. 8 illustrates two embodiments of memory cells formed by utilizing an apertured layer external to the PMC memory cells.

A first memory cell 91 is formed from precursor 90 which has an inert electrode 94, fast ion conductor material 95, and a thin metal layer 96. In this embodiment, fast ion conductor material 95 is positioned between inert electrode 94 and metal layer 96. UV light, optionally in conjunction with heat, is applied to precursor 90 through aperture 125 in apertured layer 120. Superionic clusters 98 form when metal ions from fast ion conductor material 95 and from metal layer 96, initiated by the UV light, flow toward inert electrode 94.

A second memory cell 101 is formed from precursor 100 which has an inert electrode 104, fast ion conductor material 105, and a thin metal layer 106. In this embodiment, metal layer 106 is positioned between fast ion conductor material 105 and inert electrode 104. UV light, optionally in conjunction with heat, is applied to precursor 100 through aperture 125 in apertured layer 120. Superionic clusters 108 form when metal ions from fast ion conductor material 105 and from metal layer 106, initiated by the UV light, flow to inert electrode 104.

Not illustrated in FIG. 8 is the active electrode that would be present in memory cells 91, 101 opposite inert electrode 94, 104.

Making memory cell 91, 101 can be done in a manner similar to memory cell 30, memory cell 50 or memory cell 70.

As described above, to write to any of the PMC memory cells of this disclosure, a negative bias is applied to the inert electrode, to create a flow of electrons between the electrodes to link the superionic cluster and form an electrical path from the inert electrode to the active electrode. This electrical path dramatically reduces the resistance between the electrodes.

To read the PMC, a small voltage is applied across the cell. If the electrical path formed by superionic clusters is present in that cell, the resistance will be low, leading to higher current, which can be read as a "1". If there is no electrical path formed by superionic clusters, the resistance is higher, leading to low current, which can be read as a "0".

Thus, embodiments of the PROGRAMMABLE METALLIZATION MEMORY CELLS VIA SELECTIVE CHANNEL FORMING are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method of making a programmable memory cell structure comprising:
   providing a first electrode;
   forming an internal layer comprising an apertured insulating layer having a plurality of apertures therethrough and a fast ion conductor material proximate the first electrode, the fast ion conductor material present within the plurality of apertures;
   applying a metallic material over the internal layer;
   irradiating the metallic material to cause metal ions to at least partially dissolve into the fast ion conductor material; and
   after irradiating, providing a second electrode over the metallic material forming a programmable memory cell having a plurality of apertures disposed between the first electrode and the second electrode, the metallic material separating the insulating layer from the second electrode.

2. The method of claim 1 wherein the irradiating comprises irradiating with UV light.

3. The method of claim 1 wherein the irradiating step further comprises heating the metallic material to cause metal ions to at least partially dissolve into the fast ion conductor material.

4. The method of claim 1 wherein forming an internal layer comprises:
   positioning the apertured insulating layer proximate the first electrode; and
   applying the fast ion conductor material within the plurality of apertures of the apertured layer.

5. The method of claim 1 wherein forming an internal layer comprises:
   applying a layer of the fast ion conductor material proximate the first electrode; and
   positioning the apertured insulating layer on the layer of the fast ion conductor material and receiving fast ion conductor material within the at least one aperture.

6. The method of claim 1 wherein the internal layer comprises the apertured layer extending between the first electrode and the metallic material.

7. The method of claim 1 wherein the internal layer comprises the fast ion conductor material between the apertured layer and the first electrode.

8. The method of claim 1 wherein the internal layer comprises the fast ion conductor material between the apertured layer and the metallic material.

9. The method of claim 1 wherein the irradiating step forms columnar superionic clusters.

10. The method of claim 9 wherein the columnar superionic clusters are disposed within the aperature.

11. A method of making a programmable memory cell comprising:
    providing a first electrode;
    disposing a fast ion conductor material layer on the first electrode;
    forming an internal layer on the fast ion conductor material layer, the internal layer comprising an apertured insulating layer having a plurality of apertures therethrough and a fast ion conductor material within the plurality of apertures and the fast ion conductor material layer separating the internal layer from the first electrode;

applying a metallic material over the internal layer;

dissolving metal ions from the metallic material into the fast ion conductor material to form columnar superionic clusters; and providing a second electrode over the metallic material the metallic material separating the insulating layer from the second electrode.

12. The method of claim 11 wherein the dissolving step comprises irradiating the metallic material with UV light.

13. The method of claim 12 wherein the dissolving step further comprises heating the metallic material.

14. The method of claim 11 wherein the dissolving step comprises heating the metallic material.

15. The method of claim 11 wherein the columnar superionic clusters are disposed within the aperature.

16. A method of making a programmable memory cell comprising:

providing a first electrode;

forming an internal layer comprising an a fast ion conductor material and a layer of metallic material on the first electrode;

placing an apertured layer having a plurality of apertures therethrough over and spaced apart from the internal layer;

irradiating the metallic material through the apertured layer to cause metal ions to at least partially dissolve into the fast ion conductor material and form a plurality of columnar superionic clusters; and providing a second electrode over the internal layer material forming a programmable memory cell having a plurality of columnar superionic clusters disposed between the first electrode and the second electrode.

17. The method of claim 16 wherein the columnar superionic clusters are between the layer of metallic material and the first electrode.

18. The method of claim 16 wherein the layer of metallic material is between the columnar superionic clusters and the first electrode.

* * * * *